United States Patent [19]
Walsh

[11] 3,959,694
[45] May 25, 1976

[54] ELECTRICAL CIRCUIT PROTECTION APPARATUS

[75] Inventor: Edward George Walsh, Galena, Ohio

[73] Assignee: Bell Telephone Laboratories, Incorporated, Murray Hill, N.J.

[22] Filed: Dec. 30, 1974

[21] Appl. No.: 537,204

[52] U.S. Cl. .............................. 317/18 R; 317/31; 317/51; 317/62; 335/151; 335/153
[51] Int. Cl.² ........................................ H02H 3/10
[58] Field of Search .................. 317/16, 18, 31, 51, 317/62; 335/151, 153; 337/19, 28; 340/248 C, 253 A

[56] References Cited
UNITED STATES PATENTS

| | | | |
|---|---|---|---|
| 2,329,518 | 9/1943 | Dimond | 317/18 R X |
| 3,492,532 | 1/1970 | Fayling | 317/16 |
| 3,858,089 | 12/1974 | Poindexter | 317/61 X |

FOREIGN PATENTS OR APPLICATIONS

| | | | |
|---|---|---|---|
| 378,584 | 7/1923 | Germany | 317/51 |

*Primary Examiner*—J. D. Miller
*Assistant Examiner*—Harry Moose
*Attorney, Agent, or Firm*—W. H. Kamstra

[57] ABSTRACT

An electrical circuit protective arrangement in which a reed spring relay has provided a back contact probe element associated with one of the springs and makes contact therewith when the normally closed springs are open and presents a gap with the associated spring when the springs are closed. The springs are serially connected in the electrical circuit and are of a magnetically responsive material so that the springs are forced open when an undesirably high current is present in the circuit which in turn completes a detection and alarm circuit when the probe element makes contact with the spring. The relay envelope contains a gas which ionizes in the gap to complete the same detection and alarm circuit when a dangerously high voltage appears across the gap although the springs remain closed.

9 Claims, 1 Drawing Figure

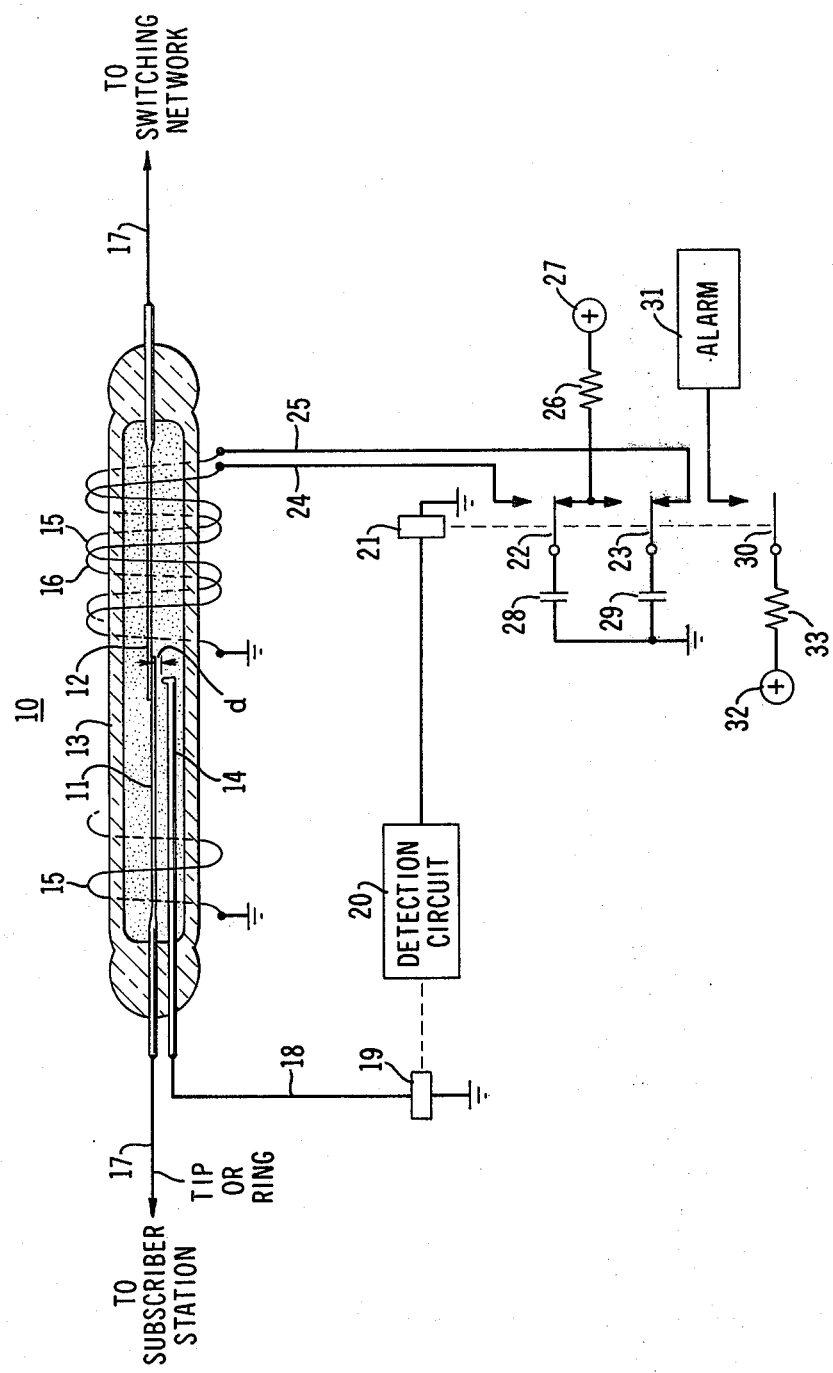

ELECTRICAL CIRCUIT PROTECTION APPARATUS

BACKGROUND OF THE INVENTION

This invention relates to the interconnections of individual lines and central switching apparatus of communications systems and particularly to protective circuits and devices for dealing with excessive voltages and currents which may appear on such lines.

The necessity for providing protection for communications apparatus and lines, or for any other electrical circuitry, for that matter, against damage resulting from excessive voltages and currents has long been recognized in the art. Such excessive voltages and currents may appear on either or both of the tip and ring conductors of a telephone system, for example, as power crosses resulting from direct metallic contact with a power distribution line. Power crosses may also occur as the result of magnetic induction arising from power line ground faults. In either case, power cross faults may seriously affect the operation of a switching system by causing the registration of false call originations, relay contact damage, for example, and in extreme cases, by presenting a fire and personal injury hazard. One common means for guarding communications equipment against damage is the carbon block protector connected to each of the tip and ring conductors of an individual line which, upon breakdown, operates to short foreign potentials to ground before damage can occur. Such protectors, however, frequently fail to operate as a complete safeguard since foreign potentials which fall short of the breakdown voltage may still be present to cause damage. Heat coils and fuses are also commonly employed as protective devices; these have the disadvantage in specific applications of possibly failing to respond in sufficient time to prevent circuit or equipment damage. Furthermore, since both excessive voltages and excessive currents may be involved, two separate protectors are generally required.

It is thus one object of this invention to provide a new and novel electrical circuit protective arrangement which responds rapidly and positively to both excessive voltages and currents of predetermined magnitudes.

Another object of this invention is a novel communication line protective circuit which responds rapidly and positively to both excessive voltages and currents to control the continuity of the line.

A further object of this invention is to provide a new and novel circuit fusing device.

SUMMARY OF THE INVENTION

The foregoing and other objects of this invention are realized in one illustrative circuit arrangement, a significant component of which is a novel reed spring relay. The relay comprises a pair of magnetically responsive reed springs adapted to make electrical contact at respective ends, the springs being conventionally encapsulated in a glass envelope about which operating coils are wound. In addition to the two main springs, the envelope also contains a probe element which is adapted to make electrical contact with one of the springs as it is released from a normal make state, the probe element conveniently emerging from the glass envelope at the latter spring end. Finally, before sealing, a gas is introduced into the glass envelope which is ionizable by a predetermined voltage appearing across the gap between the spring and probe element end. The reed springs of the relay are serially inserted in the exemplary circuit arrangement which, for example, may comprise a tip or ring conductor of a telephone subscriber line. The probe element is connected to ground through a current detection means which in turn controls the energization of the relay coils. The current detection means may also control the energization of an alarm signaling means such as a light or bell, or may serve to control the condition of other circuitry of the telephone system affected by excessive voltages or currents on the subscriber line.

Thus, assuming a fault resulting in an excessive voltage across the tip or ring conductors, or both, in which the relay of this invention is connected, the gas within the envelope will ionize between the reed spring and probe element. As a result, a current appears in the circuit between the reed spring and ground, the circuit including the ionized probe element gap. The detection circuit means controls, by controlling the energization of a release coil, the opening of the reed springs. When this occurs, a physical connection will be made between the reed spring and probe element. This effectively removes the faulty voltage from subsequent stages of the switching equipment. When the faulty voltage is removed from the line (or falls to an acceptable level) the detection circuit causes the energization of the operate coil of the relay to restore the make state of the springs and thereby the continuity of the line conductor. It will be apparent that the character of the enclosed gas, its pressure, and the dimension of the reed spring-probe element gap are factors which will determine the operating point of the protective circuit thus generally considered and these factors are chosen in accordance with the voltage levels determined as acceptable.

A second operative mode of the protective circuit of this invention turns to account a particular characteristic of the magnetically responsive reed springs of the relay contemplated for use in connection with this invention. The springs of the relay are fabricated of a magnetically remanent material such as that known commercially as remendur, for example, which make possible the latching of the reed springs after the coil energizing current has been removed. Excessive current surges through the springs, however, cause magnetic fields of a character to cause the release of the reed springs in a manner to be described in detail hereinafter. As the springs are released, one makes contact with the probe element to complete the circuit to ground as briefly described in the foregoing to remove the excessive current from the subsequent stages of the subscriber line. In this mode of operation, energization of the release coil by the detection circuitry will have no effect since the reed spring contacts are already open. The springs will be restored as described above when the excessive current surge is removed or falls to an acceptable level as determined by the detection circuitry.

One feature of this invention is thus a novel, gas-filled, reed spring relay element which advantageously operates in two modes to control the operation of its electrical contacting elements responsive to voltages or currents present in the elements themselves.

BRIEF DESCRIPTION OF THE DRAWING

The foregoing and other objects and features of this invention will be better understood from a consideration of the detailed description of the organization and operation of one illustrative embodiment thereof which follows when taken in conjunction with the single figure of the drawing which depicts in schematic and block symbol form one specific protective circuit according to the invention, the relay envelope being shown in cross section in order better to indicate the relationship of the enclosed electrical contacting elements.

DETAILED DESCRIPTION

The details of one illustrative electrical protective circuit according to the principles of this invention are shown in the drawing as comprising a relay element 10 which comprises a pair of reed springs 11 and 12 normally having their contacting ends in electrical contact when the reeds are appropriately magnetized. The other ends of the springs extend through the walls of an encapsulating envelope 13 which may be fabricated of glass as is well known in the art. The envelope 13 is shown in cross section in the drawing to clarify the relationship of the springs 11 and 12 with a third element therein, a probe element 14. The latter element may extend through either end wall of envelope 13 and presents at its other end a gap $d$ with the lower spring 11 as viewed in the drawing. Wound around the envelope 13 in a conventional manner is a pair of energizing coils 15 and 16, one end of each of which is connected to ground. The reed springs 11 and 12 in the illustrative arrangement being described are contemplated as being fabricated of a remanently magnetic material having substantially rectangular hysteresis characteristics, such as, for example, the material known commercially as remendur. The envelope 13, before sealing, has introduced therein one of the well known gases, such as, for example, argon, nitrogen, helium, or hydrogen, as determined by factors which will be considered in detail hereinafter.

The reed springs 11 and 12 are serially connected in the electrical circuit which is to be protected by the arrangement of this invention; in the illustrative embodiment being described, this circuit is contemplated as including the tip and ring conductors of a telephone system subscriber line. Since such an adaptation would be identical for both, only one conductor need be shown for an understanding of this invention. A tip or ring conductor 17 is thus shown as extending from a subscribeer station, not shown, to the switching network at the telephone central office, also not shown in the drawing. The probe element 14 is connected at its external end to ground via a conductor 18 and the winding of an electromagnet 19. For reasons which will become apparent hereinafter, a microswitch interface circuit 20 controlled by the electromagnet 19 is provided to function as a detection circuit means. The details of the circuit 20 are not shown in the drawing as not necessary for a complete understanding of the invention and, in any event, as being well known in the art. The circuit 20 may thus comprise a magnetically-operated solid-state microswitch having a winding for controlling the operation of a relay 21 in its output of the character commercially available from the Micro Switch division of the Honeywell Corporation, for example. Relay 21 controls the operation of a pair of transfer springs 22 and 23 which, in turn, control pairs of make and break contacts, respectively. The make contact associated with spring 22 is connected to the ungrounded end of relay coil 16 via a conductor 24 and the break contact associated with spring 23 is connected to the ungrounded end of relay coil 15 via a conductor 25. The make and break contacts associated with the springs 22 and 23, respectively, are connected through a resistor 26 to a source of positive potential 27. The springs 22 and 23 are connected to ground via capacitors 28 and 29, respectively. Relay 21 also controls the operation of a spring 30 which, in turn, controls a make contact for completing a circuit between an alarm means 31, such as a bell or warning light, and a source of positive potential 32 via a resistor 33.

The foregoing completes the description of the organization of one illustrative protective circuit arrangement according to the principles of this invention. Before proceeding to a description of a typical operation, the relay phenomenon which advantageously makes possible the operation of this invention will be considered. In the past, at least two factors have imposed a limitation on the use of a reed spring relay of the character described in the forgoing. The maximum current that can be safely carried by the closed springs is limited by a first factor which may be termed the "crossed field" effect. The springs are conventionally closed by the longitudinal magnetic field generated by the energized coil wound about the relay envelope and the reed springs remain closed after the coil is deenergized as the result of their remanent magnetic character. When a current is present in the springs, a rotational magnetic field is produced which is orthogonal to the field present as the result of the latching remanent magnetization holding the springs together. The two fields together produce a resultant field which acts to reduce the latter remanent magnetization. As the magnitude of the current increases, the latching magnetic field reduces and, if the magnitude of this reduction is sufficiently large, the reed springs will separate.

A second factor which augments the crossed field effect on the reed springs is the $I^2R$ heating of the reed spring material. The magnetization properties of the spring material are closely related to temperature. Thus, as the temperature of the springs increases as the result of the passage of an increasing current, the flux present in the reed springs which is holding them together will rapidly decrease, thereby assisting the crossed field effect in the opening of the relay contacts. These factors, which heretofore have presented limitational problems in the use of a magnetically responsive reed spring relay, are advantageously turned to account to constitute one basis for the novel protective circuit of this invention, a typical operation of which may now be described. For this purpose it will be assumed that an excessive current is present in the circuit including the conductors 17 and reed springs 11 and 12 of relay 10 and that this current is of sufficient magnitude to render effective the factors above considered to separate the latter springs and open their contacts. As the springs separate, spring 11 is brought into electrical contact with the end of probe element 14, thereby completing a circuit from spring 11 to ground via conductor 18 and the winding of electromagnet 19. The excessive current is thus harmlessly diverted to ground. At the same time, the magnetic field generated by electromagnet 19 controls the operation of the detection circuit 20 microswitch which in turn controls the operation of relay 21, the winding of which is included in its output circuit. The microswitch of detection circuit 20 operates as an interface to tolerate a wide range of unwanted currents in the circuit being protected.

In its operated state, the relay 21 break contact at spring 22 completed a charging circuit from potential source 27 for capacitor 28. When this relay is operated, the charging circuit is opened and capacitor 28 is connected via the make contact of spring 22 to complete a circuit via conductor 24 to coil 16 of relay 10. Capacitor 28 discharges to energize coil 16 which is wound in a sense to open the springs 11 and 12. However, since springs 11 and 12 are already open, in this mode of operation, energization of coil 16 will have no effect. Relay 21 also operates its spring 23 to complete, at its make contact, a charging circuit for capacitor 29 to the potential source 27. When the excessive current is no longer present in the circuit being protected or at such time as the current falls to an acceptable level, the field generated by electromagnet 19 falls below the level necessary to operate the microswitch of detection circuit 20 and relay 21 is deenergized to restore its spring 22 and 23. As a result, capacitor 28 is reconnected to its charging potential source 27 as it is disconnected from coil 16. At this time capacitor 29 is transferred from its charging circuit and connected via the break contact of spring 23 to coil 15 via conductor 25. This coil is wound in a sense to generate a magnetic field as capacitor 29 discharges therethrough which recloses springs 11 and 12 of relay 10 to restore the protected circuit to its normal state. After capacitor 29 has discharged, the springs 11 and 12 will remain closed as a result of their remanent magnetic character.

In a second mode of operation involving a high voltage fault in the circuit being protected, when the voltage passes a permissible limit, the gas in the envelope 13 ionizes in the gap $d$ between the spring 11 and end of probe element 14. As a result, a current is caused in the energizing circuit of electromagnet 19 to carry out the energization of release coil 16 through the operation of relay 21 in the manner described in the foregoing. In this operative mode, the energization of coil 16 causes the springs 11 and 12 to separate, thereby removing the fault voltage from the circuit being protected. As soon as the fault voltage is removed, or falls to an acceptable level, the magnetic field generated by electromagnet 19 also falls to release the microswitch of detection circuit 20. Relay 21 is deenergized, coil 16 is disconnected from capacitor 28, and operate coil 15 is energized to restore the protected circuit in the manner described in the foregoing. In both modes of operation, relay 21 also serves to control, by means of its spring 30, the connection of potential source 32 to an alarm means 31 which may comprise any suitable means capable of providing a visual or audible indication of a faulty high voltage or high current condition in the protected circuit.

It will be appreciated that specific factors of the illustrative circuit of the drawing such as the particular gas sealed within envelope 13, its pressure, and the dimension of the gap $d$, for example, which were not specifically defined in the description, will be determined by the particular circuit adaptation of the invention. Thus, for example, the upper voltage level at which breakdown of the gas at gap $d$ is desired will determine not only the width of the latter gap, but also the specific nature of the gas employed and its pressure.

What has been described is considered to be only one illustrative embodiment of a protective circuit according to this invention. Accordingly, it is to be understood that various and numerous other arrangements may be devised by one skilled in the art without departing from the spirit and scope of the invention as defined by the accompanying claims. For example, it will be appreciated that an arrangement may be devised employng reed springs fabricated of a non-remanent magnetic material. This would, of course, be at the expense of providing continuous power to maintain the springs in an operated state.

What is claimed is:

1. An electrical circuit protective arrangement comprising a relay device comprising a pair of normally closed magnetically responsive reed springs included in said electrical circuit, said springs being adapted to open responsive to a predetermined current therethrough, a probe element presenting a predetermined gap with a first of said springs when said springs are closed and making electrical contact with said first spring when said springs are open, and an envelope for enclosing said probe element and said reed springs having a gas therein of a character ionizable at said gap in the presence of a predetermined voltage across said probe element and said first spring, and detection circuit means including said first spring and said probe element energized responsive to a current of a predetermined level therein for generating a control signal.

2. An electrical circuit protective arrangement as claimed in claim 1 also comprising an operate coil associated with said pair of reed springs, and means responsive to said control signal for energizing said operate coil for generating a magnetic field tending to maintain said reed springs open.

3. An electrical circuit protective arrangement as claimed in claim 2 also comprising a release coil associated with said pair of reed springs, and means responsive to the termination of said control signal for energizing said release coil for generating a magnetic field tending to close said reed springs.

4. An electrical circuit protective arrangement as claimed in claim 2 also comprising alarm means operated responsive to said control signal for indicating the presence of current of said predetermined level in said first spring and said probe element.

5. Electrical circuit apparatus comprising a pair of reed springs of a magnetic material to latch said springs in a closed state and to open said springs in the presence of a current of a predetermined level therethrough, a probe element adapted to present a gap with one of said reed springs when said springs are in said closed state and to make electrical contact with said one spring when said springs are in an open state, and an envelope enclosing said reed springs and said probe element for sealing therein a gas of a character ionizable at said gap in the presence of a predetermined voltage between said one reed spring and said probe element.

6. Electrical circuit apparatus as claimed in claim 5 also comprising detection circuit means including said one reed spring and said probe element for generating a control signal responsive to current therein of said predetermined level.

7. Electrical circuit apparatus as claimed in claim 6 also comprising an operate coil effective when energized to generate a magnetic field tending to open said reed springs and means responsive to said control signal for energizing said operate coil.

8. Electrical circuit apparatus as claimed in claim 7 also comprising a release coil effective when energized to generate a magnetic field tending to close said reed springs and means responsive to the termination of said control signal for energizing said release coil.

9. Electrical circuit apparatus as claimed in claim 8 also comprising alarm means operated responsive to said control signal.

* * * * *